United States Patent [19]

Kolondra et al.

[11] Patent Number: 4,786,814

[45] Date of Patent: Nov. 22, 1988

[54] METHOD OF REDUCING ELECTROSTATIC CHARGE ON ION-IMPLANTED DEVICES

[75] Inventors: Frank Kolondra, Delaware Township, Hunterdon County; Chung P. Wu, Hamilton Township, Mercer County, both of N.J.

[73] Assignee: General Electric Company, Schenectady, N.Y.

[21] Appl. No.: 532,898

[22] Filed: Sep. 16, 1983

[51] Int. Cl.[4] ............................................. H01T 37/00
[52] U.S. Cl. .................................... 250/492.2; 250/398
[58] Field of Search ............... 250/492.2, 492.1, 492.3, 250/397, 398

[56] References Cited

U.S. PATENT DOCUMENTS

| 3,383,180 | 5/1983 | Turner | 250/492.2 |
| 3,507,709 | 4/1970 | Bower | 148/1.5 |
| 3,908,183 | 9/1975 | Ennis, Jr. | 357/65 |
| 4,011,449 | 3/1977 | Ko et al. | 250/492.2 |
| 4,118,630 | 10/1978 | McKenna et al. | 250/492.2 |
| 4,135,097 | 1/1971 | Forneris et al. | 250/492 B |
| 4,283,631 | 8/1981 | Turner | 250/492 B |
| 4,361,762 | 11/1982 | Douglas | 250/492.2 |

OTHER PUBLICATIONS

Wu et al., "Electron-Flood Techniques to Neutralize Beam Charging During Ion Implantation", RCA Review, vol. 44, Mar. 1983.
"DF-3000, Ion Implantation System", Varian Extrion Div., Blackburn Indust. Park, Gloucester, MA 01930.

Primary Examiner—Bruce C. Anderson
Assistant Examiner—Paul A. Guss
Attorney, Agent, or Firm—Henry I. Steckler; James C. Davis, Jr.; Paul R. Webb, II

[57] ABSTRACT

Disclosed herein is a method of using an apparatus for ion implanation providing a flood of electrons to neutralize the charge on an ion-implanted wafer after implantation to prevent electrostatic sticking attraction between the wafer and the support mechanism.

4 Claims, 2 Drawing Sheets

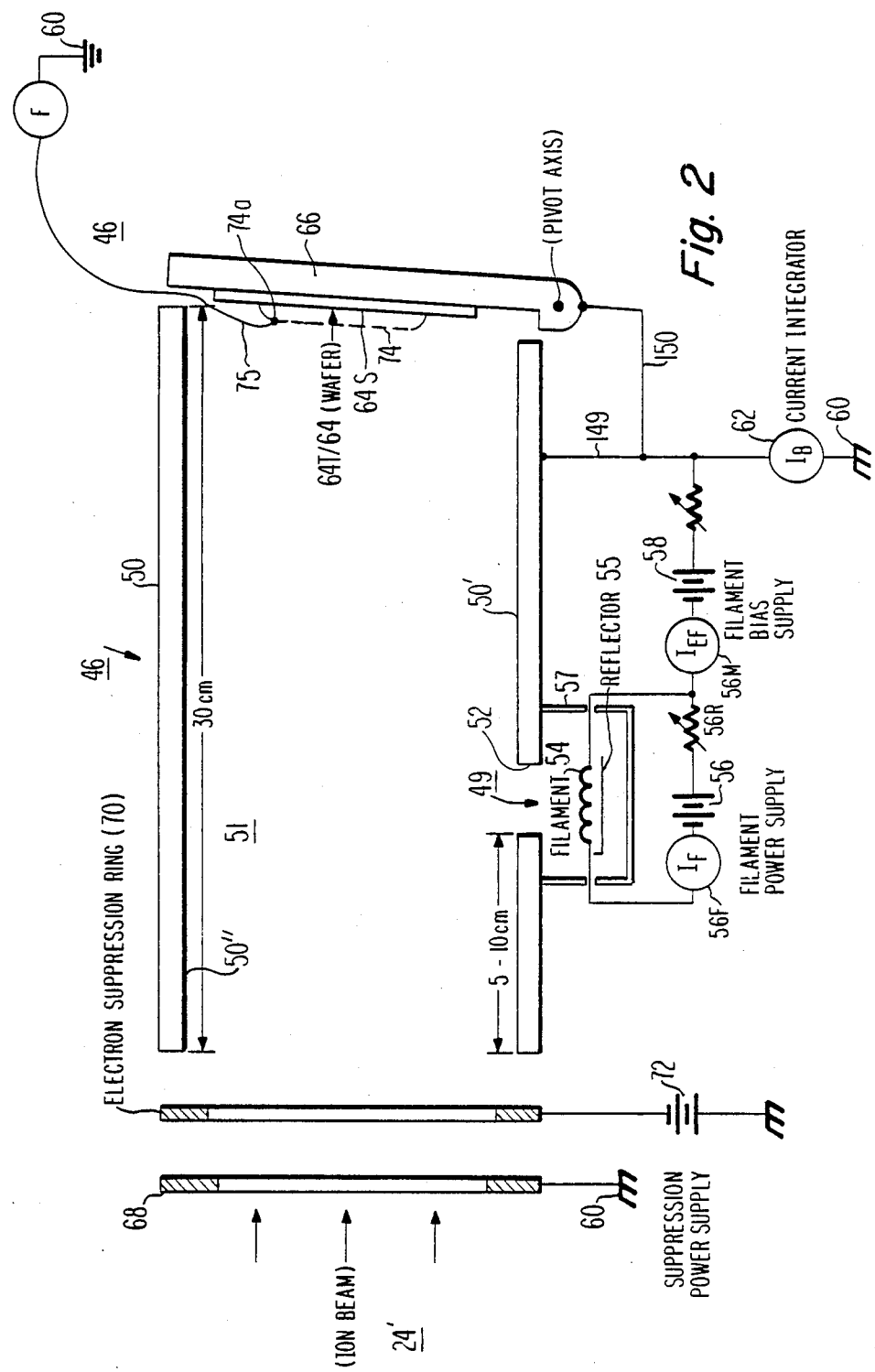

METHOD OF REDUCING ELECTROSTATIC CHARGE ON ION-IMPLANTED DEVICES

This invention relates to ion-implantation apparatus and particularly to such apparatus for providing an electron flood to neutralize residual electrostatic charges after implantation on ion-implanted devices, such as semiconductor wafers.

BACKGROUND OF THE INVENTION

The irradiation of metals and semiconductor materials by ion beams provides a means for effecting the doping of such materials in a controlled and rapid manner. Ion implantation, as the process is known, is accomplished by irradiating, for example, a semiconductor wafer with an ion beam of controlled intensity for such integrated exposure as needed to provide the desired dopant or impurity concentration. See U.S. Pat. Nos. 4,283,631 and 4,383,180 issued to N. Turner for descriptions of typical ion-implantation apparatus. It is well known that for insulating wafers such as silicon-on-sapphire (SOS) wafers, or wafers that are wholly or partially covered with an insulating layer, such as silicon dioxide ($SiO_2$) or silicon nitride ($SiO_3N_4$), the wafers may become electrostatically charged after being implanted with positively charged ions. In such a highly charged state it becomes difficult or impossible to eject the wafers from the vacuum target chamber in the conventional automatic cassette-to-cassette silicon wafer handling system because the wafers stick to the handling apparatus.

One way to avoid the sticky effect of the wafers is to utilize a conventional electron flood system in the target chamber to neutralize the ion beam while the ions are being implanted. A typical heavy dose for semiconductor wafers is the range of $10^{15}$ to $10^{16}$ ions/cm$^2$. However, this procedure is usually not practical or desirable for certain surface portions of ion-implanted devices that require relatively light or small dosages on the order of $10^{10}$ to $10^{14}$ ions/cm$^2$. Such light dosages on ion-implanted devices are used, for example, for gate threshold adjustment implants in the fabrication of metal-oxide-semiconductor (MOS) circuits which require a high degree of dose accuracy and implant uniformity. Light doses are used frequently in semi-conductor processing.

The use of electron flood systems to neutralize charged wafers and other devices that have been subjected to ion-implantation or etching is known in the art. See, for example, U.S. Pat. No. 3,908,183 issued to R. M. Ennis, Jr., on Mar. 14, 1973 which describes an ion-implantation apparatus providing post-etch flooding of the device with primary electrons for cleaning and annealing the surface of debris and the like caused by an etching process.

There is a need in the art to provide a means to eliminate the electrostatic charges on silicon wafers after implantation to minimize, if not eliminate, the stickiness effect caused by ion-implantation.

SUMMARY OF THE INVENTION

Electrostatic charges on silicon wafers after ion-implantation is substantially eliminated by providing momentarily a flood of secondary electrons from the walls of the target chamber of sufficient magnitude and duration to substantially neutralize positive charges residing on the implanted wafer.

BRIEF DESCRIPTION OF THE DRAWING

FIG. 2 is a schematic of the Faraday cage portion of the apparatus of FIG. 1 illustrating the source of electron flood emission currents for flooding the ion beam.

DETAILED DESCRIPTION OF THE PREFERRED EMBODIMENT

Figure 1:
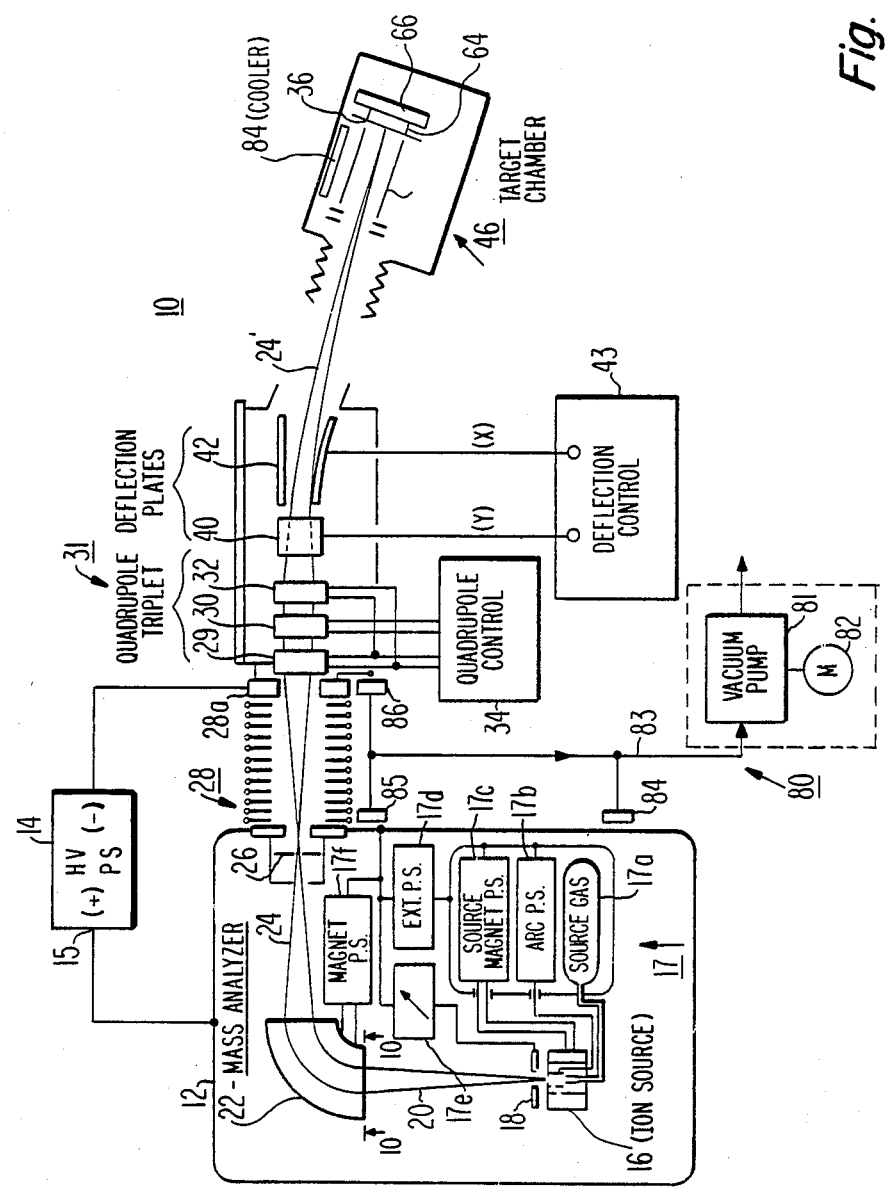
FIG. 1 is a schematic of a typical ion implantation system for practicing the present invention.

This invention is concerned with a serious problem of preventing semiconductor wafers after the ion implantation step from sticking to the apparatus, particularly apparatus of the type depending upon gravity to discharge the wafer. The sticking action preventing gravity discharge of the wafer is caused by electrostatic charges that are produced by the ion implantation process on the wafer, particularly, wafers wholly or partially covered with an insulating layer. If the wafer is a semiconductor wafer without a large portion of insulating surface, the ion-implanation dose can be quite large, on the order of to $10^{15}$ to $10^{16}$ ions/cm$^2$. For such high ion-implantation doses, the problem of preventing the sticking effect can be usually solved by flooding the ion beam with electrons during the implantation step to effectively neutralize the charge on the wafer and thereby prevent sticking. See our copending application U.S. patent application Ser. No. 532,897, filed Sept. 16, 1983, incorporated herein by reference, for a method for flooding an ion beam with electrons during ion implanting to neutralize the space-charge of the beam.

According to the present invention, if the wafer is one that is wholly or largely covered with insulating material on devices fabricated on silicon-on-sapphire (SOS) the ion-implantation dose may be required tobe much smaller, for example, on the order of $10^{10}$ to $10^{14}$ ions/cm$^2$.

For ion-implantation processes of such low dosage, the accuracy and uniformity requirements for controlling the dose are quite high. We have found that flooding the ion beam with electrons during implantation adversely affects the accuracy and uniformity of controlling the ion dose desired. Thus beams without neutralization flooding are used. However, the non-flooded ion beam tends to leave residual charges on the wafer causing it to stick to the equipment. The present invention solves this sticking effect by providing a flood of electrons after the implantation process of proper amounts and duration to eliminate the residual charge in a manner as will be now explained in detail.

Apparatus useful in practicing the invention will now be described by reference to FIGS. 1 and 2. The ion implantation apparatus 10 includes a high voltage terminal 12 maintained at a high positive potential via terminal 15 relative to a reference potential, such as ground, by a high voltage power supply (HVPS) 14. Supply 14 provides a selected voltage typically in the range of 0 to 280 keV. Terminal 12 includes structure to house the portion of the implantation apparatus 10 required to form a beam of ions of desired species. In practice, a gaseous feed stock of the desired species is employed such as from a source 16 to provide ions of various forms including singly- and doubly-charged ions of the desired specie. A typical ion source 16 will require a system supply 17 to maintain the ionized discharge, and to impose axial magnetic fields across the discharge region and an extraction supply cooperating with the electrode 18 to shape the electric field at the aperture of the source 16 for effective development of a well-defined high current ion beam 20. Thus, supply 17 will include a source gas 17a directed to ion source 16. Supply 17 further includes an arc power supply 17b to sustain an ionizing discharge, a power supply 17c to impose an axial magnetic field across the discharge region, and extraction and power supply 17d, and vernier 17e cooperative with the electrode 18 to shape the electric field at the aperture of the ion source 16 for effective control of a well defined high current ion beam 20.

The ion beam 20 diverging from the source 16 is momentum analyzed by an arcuate-shaped mass analyzer 22 to provide the desired ion beam 24. A magnet of analyzer 22 is energized by magnet power supply 17f. The analyzed ion beam 24 passes through the analyzer exit slit 26 and then to an accelerator tube 28 where it encounters a carefully designed field gradient from the high, relatively positive, voltage terminal 12 to a relatively negative or ground potential terminal 28a. An electrical optical device such as a conventional "quadrupole triplet" 31 comprising control elements 29, 30 and 32 under control of a quadrupole control 34 is operated to produce spatial-energy focus of the beam at a desired image plane 36. Two sets of electrostatic deflection plates 40 and 42 serve to direct the beam over the desired area of the image plane 36 in the target chamber 46. A suitable deflection scan control 43 is provided to control the deflection plates 40 and 42 arbitrarily labeled y and x, respectively.

Assuming the ion source 16 is arranged to provide gaseous phosphorus ions, the beam 20 will contain phosphorus ions that will be guided to the mass analyzer 22. The magnet of analyzer 22 is suitably provided with appropriate currents as known in the art to separate the particles in the beam 20 into the desired mass of the ion. The ions of phosphorus will traverse the arcuate path defined by the analyzer 22 and will exit as a beam to define the beam 24 of phosphorus ions. The analyzer 22 will separate from the beam 20 all particles that are not of the same mass and charge as the mass and charge of phosphorus.

A conventional vacuum pumping apparatus 80, including a pump 81 and a meter 82, provides vacuum in the system by way of conduit 83 coupled to connectors 84, 85, 86, etc., suitably attached to selected portions of the apparatus 10.

Reference is made to FIG. 2 for a more detailed schematic of the target chamber 46 of FIG. 1, showing, in particular, means 49 providing electron flood emission current ($I_{EF}$) for neutralizing the space-charge of the ion beam 24'. The target chamber 46, typically rectangular in cross section, comprises a conventional Faraday cage 50 having an opening 52 of convenient shape, suitably a rectangle, in the wall 50' through which high energy electrons are emitted into the chamber 51 without a direct path to the target 64. The high energy electrons are derived from a tungsten filament 54 energized by a suitable filament power supply 56 conveniently shown as a battery, but typically a.c. powered via a transformer, which, in turn, is biased by a battery power supply 58 with respect cage 50 and to ground 60. Electrons emitted from the filament 54 are passed through the opening 52 and thence into the chamber 51 aided by means of a reflector 55 suitably positioned within a housing 57 for the filament 54.

The filament supply 56 is adjustable to a predetermined and fixed value by adjustable resistor 56R to provide the desired filament current ($I_F$) as measured by meter 56F.

The electron flood current ($I_{EF}$) which flows from the filament 54 as electrons into chamber 51 and strikes the cage walls 50' and 50" as well as secondary electrons which restrike the walls can return to the electron flood supply 49 via path 149. Flooding current ($I_{EF}$) which is captured by an ion beam 24' in the form of low energy secondary electrons from the walls, or high energy primary electrons directly from the filament 54, will be carried by the beam to the wafer 64 and eventually to the support platen 66 and thereby returned to the supply 49 via path 150.

The ion beam current ($I_B$) is measured by current integrator 62. The current ($I_B$) is measured only with the ion beam 24' operating.

The manner of determining what that predetermined flooding current ($I_{EF}$) value is, according to the present invention, will be described in detail hereinafter.

In typical operation, after calibration, a conventional target 64, typically a wafer, is mounted on a platen support 66. In practice, the support 66 will include a conventional wafer carrier mechanism (not shown) for carrying and positioning in sequence a plurality of wafers 64 to and from the ion implant position plane 36 (FIG. 1). The ion beam 24' after it passes through the deflection plates 40 and 42, as shown in FIG. 1, is passed through a beam aperture ring 68 electrically connected to ground 60. An electron suppression ring 70 is spaced about 0.5 inch (1.25 cm) between, respectively, the ring 68 and the cage 50 and is negatively biased with a voltage of approximately $-500$ volts from battery supply 72. The ring 70, when energized, serves to suppress electrons which may pass rearwardly (upstream of beam 24') from the cage 50. The system of FIG. 1 providing an ion beam 24' to the Faraday cage 50 is otherwise operated in a conventional manner, as indicated above, and will not be described in detail herein.

During the operation of the implanter 10 with ion doses of $10^{15}$ ions/cm$^2$, it has been found that such a dose is so heavy that if precautions are not made large charges will accumulate on insulated islands or portions of a wafer to cause disastrous arcing destroying the wafer. As described in our above-mentioned copending application U.S. patent application Ser. No. 532,897, filed Sept. 16, 1983, the ion beam is flooded with electrons by means of the electron flooding means 49 of FIG. 2 to neutralize the space-charge of the beam to obviate such charging. When the beam is flooded with electrons, the problem of sticking wafers at the end of the implantation process is inherently solved since the wafer will have virtually no charge remaining, on it. However, for use of the implanter 10 with doses of ions in the range of less than $10^{15}$ ions/cm$^2$, particularly in the range of $10^{10}$ to $10^{14}$ ions/cm$^2$, flooding the ion beam with electrons during the process of implantation seriously affects the accuracy and uniformity requirements that are so essential for certain implantation processes. Accordingly, the ion beam with such dose ranges tend to develop residual charges on the wafer which cause the sticking effect described hereinabove whereby the wafer sticks to the final discharge station and cannot be easily ejected from the system.

According to the present invention, the wafers are flooded with electrons from the electron flooding means 49 of FIG. 2 after the ion beam 24' has been shut off. Accordingly, after the current integrator 62 has indicated that the correct dose of the particular ions have been satisfied, the ion beam 24' is shut off. At this time, the electron flood system 49 is energized to momentarily neutralize any positive charges that may be residing on the implanted wafer 64. The implanted wafer 64 can be safely overloaded with electrons with energies of only about 5-15 electron volts scattered from the walls of the Faraday cage 50. We were confronted with the problem to determine the minimum safe amounts of post-implant electron flooding. After many experiments we have determined that the amount of current needed and the amount of time for electron flooding the wafer is less than the amount of current that is needed to flood an active beam during the implantation process. Using the technique described in our copending application, we have discovered that about 6 milliamperes of flooding current ($I_{EF}$) is needed for a continuous beam during implantation to prevent arcing voltages on the wafer. If we provide 6 milliamperes of current ($I_{EF}$) for the durations of 1 to 3 seconds, the sticking effect will surely be eliminated. However, after many experiments we have discovered that the amount of current needed for electron flooding the wafer after implantation is in the order of only 1 milliampere for periods of 1-3 milliseconds. The following is a chart of the most typical dosages required.

| Dose of Ions (per cm$^2$) | Electron Flood Current ($I_{EF}$) | Time |
| --- | --- | --- |
| $10^{10}$–$10^{11}$ | 1 ma. | 1 sec. |
| $10^{12}$–$10^{13}$ | 1 ma. | 2 sec. |
| $10^{13}$–$10^{14}$ | 1 ma. | 2-3 sec. |

The manner in which the flood system 49 is operated is similar to that described in our aboveidentified copending application. In this regard it is noted that the electron gun means 49 is located near the ion beam entrance of the Faraday cage 50. Note that the opening 52 in the wall is arranged so that there is no direct line of sight between the tungsten filament 54 and the surface of the target 64. This arrangement insures that damage to the target, such as a semiconductor device 64, by high-energy electrons emitted from the flood means 49 is avoided. Moreover, direct contamination of the target from the electron gun 49 filament is also avoided.

The electron flood gun emission current ($I_{EF}$) as measured by meter 56M is adjustable by the use of resistor 56 R, for example, in the range of zero to 15 milliamperes.

What is claimed is:

1. A method of reducing residual electrostatic charge on an ion-implanted wafer comprising the steps of:
   (a) implanting said wafer with a predetermined dose of ions in the range of to $10^{10}$ to $10^{14}$ ions/cm$^2$; and
   (b) subsequent to implanting said wafer flooding said wafer for one to three seconds with sufficient secondary electrons to neutralize positive charges on said wafer.

2. The method of claim 1 wherein said ion dose is $10^{10}$ ions per cm$^2$ and the current for generating said secondary electrons is one milliampere for one second.

3. The method of claim 1 wherein said ion dose is $10^{12}$ ions per cm$^2$ and the current for generating said secondary electrons is one milliampere for two seconds.

4. The method of claim 1 wherein said ion dose is $10^{13}$ ions per cm$^2$ and the current for generating said secondary electrons is one milliampere for three seconds.

* * * * *